(12) United States Patent
Yang

(10) Patent No.: US 10,856,457 B2
(45) Date of Patent: Dec. 1, 2020

(54) ELECTROMAGNETIC SHIELDING FILM FOR CABLE

(71) Applicant: NANCHANG UNITETEC TECHNOLOGY CO., LTD., Jiangxi (CN)

(72) Inventor: Tien-Wei Yang, Jiangxi (CN)

(73) Assignee: NANCHANG UNITETEC TECHNOLOGY CO., LTD., Jiangxi (CN)

( * ) Notice: Subject to any disclaimer, the term of this patent is extended or adjusted under 35 U.S.C. 154(b) by 0 days.

(21) Appl. No.: 16/489,694

(22) PCT Filed: Apr. 28, 2017

(86) PCT No.: PCT/CN2017/082454
§ 371 (c)(1),
(2) Date: Aug. 28, 2019

(87) PCT Pub. No.: WO2018/195922
PCT Pub. Date: Nov. 1, 2018

(65) Prior Publication Data
US 2020/0015393 A1    Jan. 9, 2020

(51) Int. Cl.
*H05K 9/00* (2006.01)
*H01B 7/295* (2006.01)
*H01B 13/26* (2006.01)

(52) U.S. Cl.
CPC .......... *H05K 9/0098* (2013.01); *H01B 7/295* (2013.01); *H05K 9/0088* (2013.01); *H01B 13/26* (2013.01)

(58) Field of Classification Search
CPC .................................................. H05K 9/0098
See application file for complete search history.

(56) References Cited

U.S. PATENT DOCUMENTS

| 6,211,459 B1 | 4/2001 | O'Groske et al. |
| 2005/0029000 A1* | 2/2005 | Aisenbrey ............ H01B 1/22 174/388 |
| 2013/0213691 A1* | 8/2013 | Park ................. H01L 24/29 174/126.4 |

FOREIGN PATENT DOCUMENTS

| CN | 101000810 A | 7/2007 |
| CN | 106531311 A | 3/2017 |

(Continued)

OTHER PUBLICATIONS machine translation of CN106531311, (Yang), Specification, May 9, 2020, 10 pages (Year: 2020).*

(Continued)

*Primary Examiner* — Hung V Ngo
(74) *Attorney, Agent, or Firm* — Yue (Robert) Xu; Apex Attorneys at Law, LLP

(57) ABSTRACT

An electromagnetic shielding film for a cable, which relates to the field of wire manufacturing, for use in resolving the problem of easiness of break of the existing electromagnetic shielding film and the great consumption of time and power in the preparation process. The electromagnetic shielding film comprises a first metal layer (11,21,31,41), a conductive layer (12,22,32,42), and a protective film (13,23,33,43). The first metal layer covers the outer part of a conductor of a cable, and is used for shielding electromagnetic interference and is used as a medium. The conductive layer is disposed on the first metal layer, and is used for shielding electromagnetic interference, and the conductive layer comprises a curing agent, metal particles and polyurethane for carrying the metal particles. The protective film is disposed on the conductive layer and protects the electromagnetic shielding film.

8 Claims, 8 Drawing Sheets

(56) References Cited

FOREIGN PATENT DOCUMENTS

| CN | 106531344 A | 3/2017 |
|---|---|---|
| CN | 106952678 A | 7/2017 |

OTHER PUBLICATIONS

International Search Report for PCT/CN2017/082454 dated Feb. 1, 2018, ISA/CN.

* cited by examiner

ELECTROMAGNETIC SHIELDING FILM FOR CABLE

This application is the national phase of International Application No. PCT/CN2017/082454, titled "ELECTROMAGNETIC SHIELDING FILM FOR CABLE", filed on Apr. 28, 2017, which is incorporated herein by reference in entirety.

FIELD

The present disclosure relates to the field of cable manufacturing, specifically to an electromagnetic shielding film for a cable.

BACKGROUND

In the cable manufacturing industry with signal transmission and/or power transmission, in order to reduce the impedance and attenuation, prevent the interference of signal and prevent the loss of internal transmission, an electromagnetic shielding layer is always added to the wire to perform an electromagnetic shielding treatment. A common method is coating the conductor layer by layer with at least two layers of shielding materials and by at least two manufacturing procedures. That is, after the producing of conductor is completed and a jacket of the conductor is coated, a layer of Mylar aluminum foil is needed to be firstly coated and then a metal braided layer is coated on the Mylar aluminum foil. As there are grids on the braided layer, the coating and braiding need to be carried out for more than once according to the requirement of the effect of electromagnetic shielding, i.e., a Mylar aluminum foil is combined with one or more metal braided layers to achieve the required coverage rate. However, when this method for electromagnetic shielding is used, more than one times of coating and braiding process is required, the process is complex, a large amount of raw materials are consumed, and a large amount of devices are invested for braid, so that the cost of production is largely increased. In addition, due to the metal braided layer requires processes such as electroplate, etc., the pollution to the environment is relatively serious.

In order to solve the above problems, there is an electromagnetic shielding film that may add an electromagnetic shielding layer to the cable without a braided layer needed, which needs coating a shielding film for only one time instead of the conventional process which requires multiple times of coating and braiding, and can achieve the same or a better effect, thereby largely decreasing the consumption of raw materials, reducing the cost of production, and enhancing the productivity. In addition, as processes such as electroplate are not needed, the pollution to the environment is reduced. This kind of electromagnetic shielding film usually has a multi-layer film structure, in which the conductive layer plays an important role in electromagnetic shielding. The conductive layer is usually consisting of metal particles and a hybrid resin carrying the metal particles.

However, the conductive layer made of resin in the electromagnetic shielding film has many defects. For example, the flexibility of resin is poor, and the produced conductive layer is easily broken. For example, the solution prepared by resin has a long curing time after coating. The curing process is usually carried out in a curing room at a temperature of more than 110° C. for 4-5 days, and the consumption of time and energy is relatively large.

SUMMARY

In the present disclosure, an electromagnetic shielding film for a cable is provided, which is used for solving the problems that the conventional electromagnetic shielding film breaks easily and the producing process has a large consumption of time and energy.

In one aspect, the embodiment of the present disclosure provides an electromagnetic shielding film for a cable, comprising, a first metal layer, a conductive layer and a protective film;

the first metal layer is coated on a jacket of the conductor of the cable, and is used for shielding electromagnetic interference and acts as a medium;

the conductive layer is disposed on the first metal layer, and is used for shielding electromagnetic interference, and the conductive layer comprises a curing agent, metal particles and a polyurethane for carrying the metal particles; and the protective film is disposed on the conductive layer, and is used for protecting the electromagnetic shielding film.

Optionally, the conductive layer further comprises an epoxy resin, which is used for increasing the adhesiveness of the conductive layer.

Optionally, the metal particles are combined particles formed from two or more kinds of metals.

Optionally, the protective film is an engineering film.

Optionally, the metal particles accounts for 10%-80% by mass of the conductive layer.

Optionally, the electromagnetic shielding film further comprises an insulating layer, and the insulating layer is disposed on the conductive layer, or is disposed on the protective film.

Optionally, the insulating layer comprises polyurethane and a coloring pigment.

Optionally, the insulating layer further comprises a filler, which is used for increasing the filtering capability of the insulating layer on an electromagnetic wave; and the filler includes one or more of aluminum hydroxide, silicon dioxide, polyaniline and polyacetylene.

Optionally, the insulating layer further comprises a fire retardant.

Optionally, the electromagnetic shielding film further comprises a second metal layer, wherein the second metal layer is disposed on the conductive layer, and is used for shielding in cooperation with the conductive layer.

It can be concluded from the above technical solutions that the embodiments of the present disclosure have following advantages:

the present disclosure provides an electromagnetic shielding film for a cable, comprising a first metal layer, a conductive layer and a protective film; the first metal layer is coated on a jacket of the conductor of the cable, and is used for shielding electromagnetic interference and acts as a medium; the conductive layer is disposed on the first metal layer, and is used for shielding electromagnetic interference, and the conductive layer comprises a curing agent, metal particles and a polyurethane for carrying the metal particles; and the protective film is disposed on the conductive layer, and is used for protecting the electromagnetic shielding film Since the flexibility of polyurethane is superior to that of resin, the electromagnetic shielding film made from it has excellent suppleness and toughness, which can meet the requirement of compactibility when it is twined and coated on the electric wire and electric cable. In addition, the solution made of polyurethane has a short curing time and a low curing temperature after coating, and the curing process is usually carried out in a curing room at a temperature lowering than 80° C. for 2 days, thereby saving time and electric energy, improving production efficiency and reducing production cost.

DETAILED DESCRIPTION

Figure 1:
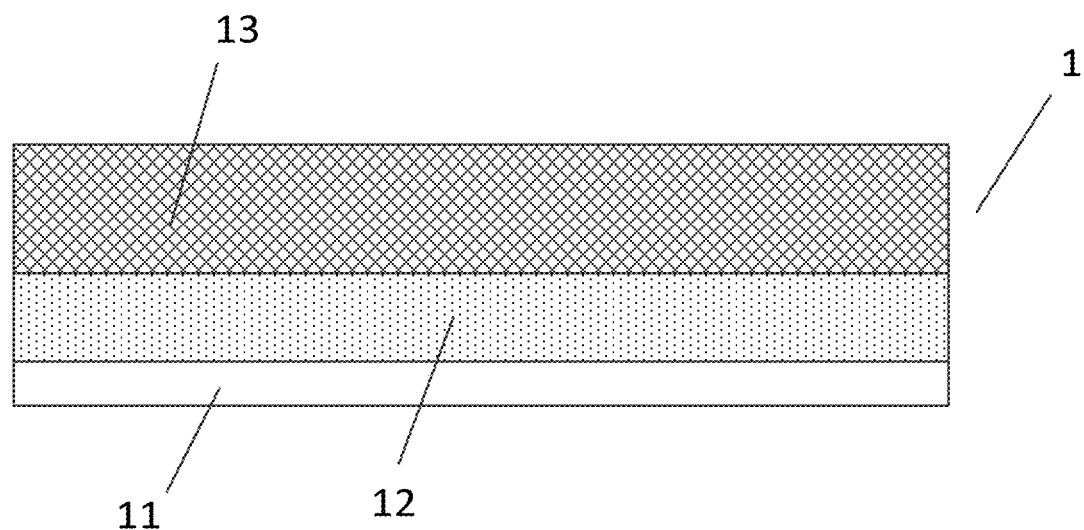
FIG. 1 shows a structure of the electromagnetic shielding film for a cable of the present disclosure.

The embodiment of the present disclosure provides an electromagnetic shielding film for a cable, which can solve the shielding problem by coating for only one time when performing a shielding treatment of the cable, and the film has a good flexibility and a lower production cost.

In order to help those skilled in the art to better understand the technical solutions of the present disclosure, the technical solutions in the embodiments of the present disclosure will be clearly and completely described in conjunction with the accompanying drawings in the embodiments of the present disclosure hereinafter. It is apparent that the described embodiments are merely a part of the embodiments of the disclosure, and not all of the embodiments. All other embodiments obtained by those skilled in the art based on the embodiments of the present disclosure without creative efforts shall fall within the scope of the protection of the present disclosure.

In the specifications, claims and the above drawings of the present disclosure, terms "first", "second", "third", "fourth", etc. (if present), are used to distinguish the similar objects, but are not used to describe the specific orders or precedence orders. It should be understood that the data used here may be changed under proper situations, so that the embodiments described herein can be implemented in an order other than the contents described in the figures or descriptions herein. In addition, terms "comprise" and "have" and any modifications thereof intend to define a non-exclusive inclusion. For example, a process, method, system, product, or device that comprises a series of steps or units are not limited to the steps or units that are explicitly listed, but may include other steps or units that are not explicitly listed or are inherent to the process, method, product or device.

In the prior art, the cable is usually wrapped by braiding with metal on the mylar aluminum foil, to form an electromagnetic shielding layer of a cable. As there are grids on the braided layer, the braiding is usually carried out for more than once in the prior art to enhance the shielding, thereby reducing the productivity, increasing the cost of production, increasing the diameter of the packaged cable, and making the suppleness of the cable poor.

In order to solve the above problems, there is an electromagnetic shielding film that may add an electromagnetic shielding layer to the cable without a braided layer needed, which needs coating a shielding film for only one time instead of the conventional process which requires multiple times of coating and braiding, and can achieve the same or a better effect, thereby largely decreasing the consumption of raw materials, reducing the cost of production, and enhancing the productivity. In addition, as processes such as electroplate are not needed, the pollution to the environment is reduced. This kind of electromagnetic shielding film usually has a multi-layer film structure, in which the conductive layer plays an important role in electromagnetic shielding. The conductive layer is usually consisting of metal particles and a hybrid resin carrying the metal particles.

However, the conductive layer made of resin in the electromagnetic shielding film has the following defects: the flexibility of resin is poor, and the produced conductive layer is easily broken; the solution prepared by resin has a long curing time after coating, the curing process is usually carried out in a curing room at a temperature of more than 110° C. for 4-5 days, and the consumption of time and energy is relatively large; when coating the metal particles with resin, the coating is compact so that it is easy to cause a problem that the metal particles cannot contact with each other, and thus it is necessary to increase the amount of the metal particles, which however would cause production troubles in the preparation of products due to excessive metal particles, too many metal particles would generate scratches on the surface of the metal layer when coating the conductive layer and influence the appearance, and the increase of metal particles also directly influences the cost of production, causing a 10%-30% increase in production costs.

In order to solve the above problems, the present disclosure provides an electromagnetic shielding film for a cable. For ease of understanding, reference is made to FIG. 1. FIG. 1 shows a structure of the electromagnetic shielding film for a cable in an example of the present disclosure. The electromagnetic film 1 comprises a first metal layer 11, a conductive layer 12 and a protective film 13;

the first metal layer 11 is coated on a jacket of the conductor of the cable, and is used for shielding electromagnetic interference and acts as a medium;

the conductive layer 12 is disposed on the first metal layer 11, and is used for shielding electromagnetic interference, and the conductive layer 12 comprises a curing agent, metal particles and a polyurethane for carrying the metal particles; and the protective film 13 is disposed on the conductive layer 12, and is used for protecting the electromagnetic shielding film 1.

It should be noted that the first metal layer 11 can serve as the medium that facilitates the power transmission and/or signal transmission in the cable.

It can be seen that the electromagnetic shielding film 1 is actually made from a three-layer structure by superposing. The finally obtained electromagnetic shielding film 1 is still a one-layer film structure in appearance, which can be cut into belt-like shielding films with different widths according to requirement of use to match cables having different requirements.

Polyurethane (polyesters and polyethers), polyurethane elastomer are a kind of polyurethane composite material, and the structure of which has two segments, soft and hard, which can be molecular designed to give excellent performances such as high strength, abrasion resistance, oil resistance, good toughness, and witch has high elasticity as rubber and rigidity as plastics, also called "abrasion-resistant rubber". The content of the polyurethane elastomer in the conductive layer is 10%-70%. For example, the main component of polyurethane may be diisocyanate, diisocyanate derivative, polyisocyanate, polyester polyol, carbonate, phosphate, diol, dicarboxylic acid and triol.

Compared with using resin to prepare the conductive layer in the prior art, using polyurethane to prepare the conductive layer has following advantages.

1. The flexibility of polyurethane is superior to that of resin. The electromagnetic shielding film made from it has excellent suppleness and toughness, which can meet the requirement of compactibility when it is twined and coated on the electric wire and electric cable.
2. The solution made of polyurethane has a short curing time and a low curing temperature after coating, and the curing process is usually carried out in a curing room at a temperature lowering than 80° C. for 2 days, thereby saving time and electric energy, improving production efficiency and reducing production cost.
3. The polyurethane has a three-dimensional molecular structure, which will not entirely tightly coat the metal particles when combined with metal particles. Thus, compared with resin, the number of metal particles can be reduced but achieve the same effect as mixing with the resin. Under the same conditions, the amount of metal particles in a conductive layer prepared by using polyurethane reduces by 5%-15% compared to that using resin, and the cost is reduced.
4. The conductive layer prepared by using polyurethane is easy to coat during production, and is not easy to cause poor appearance, thereby reducing the reject rate.

The curing agent is used to promote the curing of the liquid product. The polyurethane, when made into a solution and coated, plays a role of curing, and the content of it in the conductive layer can be 10%-30%.

It can be seen that the electromagnetic shielding film for a cable in the present disclosure can solve the shielding problem by coating for only one time when performing a shielding treatment of the cable. Furthermore, since the flexibility of polyurethane is superior to that of resin, the electromagnetic shielding film made from it has excellent suppleness and toughness, which can meet the requirement of compactibility when it is twined and coated on the electric wire and electric cable. In addition, the solution made of polyurethane has a short curing time and a low curing temperature after coating, and the curing process is usually carried out in a curing room at a temperature lowering than 80° C. for 2 days, thereby saving time and electric energy, improving production efficiency and reducing production cost.

Optionally, the first metal layer 11 has a thickness of 3 μm to 50 μm. It is understood that the thickness of the first metal layer is determined according to the diameter of the wire. The lager the diameter of the wire is, the lager the thickness of the first metal layer 11 to be selected is. The smaller the diameter of the wire is, the smaller the thickness of the first metal layer 11 to be selected is. The thickness is different according to the actual wire, and is not specifically defined.

The first metal layer 11 a metal film consisted of at least one of gold, silver, copper, nickel and aluminum. It is understood that as the first shielding layer and as the medium, the conductivity of the first metal layer 11 is also very important. Thus, the material of the first metal layer should be selected from metals with relatively good conductivity, for example selected from one of gold, silver, copper, nickel and aluminum, or an alloy of at least two of the metals.

Conductive layer 12 may comprise isotropic conductive metal particles. As isotropic conductive metal particles are omnidirectionally conductive, their performance is easy be adjusted, and it is easy to improve the conduction performance by increasing the number of metal particles.

Alternatively, the conductive layer 12 may comprise anisotropic conductive metal particles. Anisotropic conductive metal particles have a conductive effect of longitudinally conductive and horizontally nonconductive in polyurethane, i.e., the anisotropic conductive metal particles are conductive in the direction perpendicular to the surface of the conductive layer 12 and nonconductive in the direction parallel to the surface of conductive layer 12. However, the cost of anisotropic conductive metal particle is lower than that of the isotropic metal particles. Due to there is a first metal layer 11 disposed on one side of the conductive layer 12 in the example of the present disclosure, horizontal conduction is still be able to be formed by connecting the first metal layer 11 with conductive particles. After horizontally and longitudinally conduction, a loop is formed to conduct the electromagnetic wave out, to prevent interference with the normal operation of cable.

The metal particles or the bonding particles thereof in the conductive layer 12 have shapes of regular or irregular shapes such as granule-like, flake-like, dendrite-like, snowflake-like, etc.

The polyurethane in the conductive layer 12 on one hand is used for fixing the metal particles, and on the other hand acts as the carrier of metal particles. Therein, the metal particles account for 10%-80% by mass of the conductive layer 12, and the change in the mass ratio is reflected in two aspects. In one aspect, the change in the mass ratio depends on the metal particles used. Since different metal elements have different densities, and the sizes of metal particles are substantially the same, metal particles of the same proportion by volume in the conductive layer 12 account for different proportion by mass in the conductive layer 12, and metal particles with larger density accounts for more in the same proportion by volume. In the other aspect, the change in the mass ratio is different depends on the requirements of performances of electromagnetic shielding. For example, if a higher performance of electromagnetic shielding is required, the metal particles account for a higher proportion by mass in the conductive layer 12. It is reflected in that the distance between metal particles in conductive layer 12 becomes closer and the performance of conductivity is better, so that the electromagnetic wave is attenuated more quickly. However, under conditions where the requirement to the performance of electromagnetic shielding is not very high, the metal particles account for a relatively low proportion by mass in the conductive layer 12, the distance between the metal particles are farther, and the performance of conductivity relatively decreases, so that the electromagnetic wave is attenuated more slowly. Thus, the ratio of the metal particles to the conductive layer 12 by mass may be adjusted according to requirement. On the contrary, in the prior art, if a better performance of electromagnetic shielding is required, it is necessary to perform multiple times of coating and braiding, thereby wasting a large amount of materials and causing pollution to the environment due to use of a large amount of metal net. In addition, the suppleness of the wire itself become very poor due to multiple times of coating and braiding, and thus many wires that require good suppleness and good electromagnetic shielding performance cannot be realized by methods of coating and braiding. However, the electromagnetic film in the present example, which has a very thin thickness and is a soft material per se, would not affect the suppleness of the wire.

Optionally, the thickness of conductive layer 12 is from 3 μm to 50 μm. It should be noted that there are two factors affecting the thickness of the conductive layer 12. Firstly, if the diameters of the coated wire are different, the thicknesses thereof are different. For example, for relatively thin wires, the thicknesses of the conductive layer 12 can be relatively thin; but for wires with larger diameters, in order to ensure the reliability of the wire, the conductive layer 12 need to be thicker. Secondly, the thickness can be different according to the required conductivity. For the wires requiring relatively high conductivity, a conductive layer 12 with relatively thick thicknesses can be used, which have larger cross sections, thereby having a higher conductivity. On the contrary, for the wires requiring relatively low conductivity and relatively high suppleness, conductive layer 12 with relatively smaller thickness can be used. The thickness is adjusted according to actual conditions, and is not limited.

Optionally, the isotropic conductive or anisotropic conductive metal particles can be at least one metal particles selected from a group consisting of gold, silver, copper, nickel and aluminum. Metal particles with high conductive performances can be selected, which can achieve the same conductivity with a relatively smaller ratio of metal particles, such as one of gold, silver, copper, nickel and aluminum with relatively high conductivity. Of course, another method may be used, i.e., the metal particles include an outer layer of a metal coating with high conductivity, and an inner layer of a metal having relatively weak conductivity compared with the metal coating. Of course, the metal in the inner layer needed to have good bonding ability to the metal with high conductivity, such that the conductivity thereof is better than that of the metal particles totally made from the metal in the inner layer. The metal is specifically selected according to the cost of production and the requirements of the wire.

Preferably, the metal particles in the conductive layer 12 can be totally or partly combined particles made from two or more metals, such as gold-silver combined particles. Using combined particles as metal particles in the conductive layer 12 broadens the frequency width of the electromagnetic wave shielded by the product, thereby overcoming the limitation of electromagnetic shielding of single metal particles.

Preferably, the conductive layer 12 may further comprise epoxy resin. In the above electromagnetic shielding film, the ratio of metal particles in the conductive layer 12 is generally 10%-80% by mass. When the mass ratio of metal particles in the conductive layer 12 is unduly high, the metal particles may affect the viscosity of polyurethane, resulting in poor adhesion between structural layers of the product. At this time, an appropriate amount of epoxy resin may be added into the conductive layer 12 to improve the problem of poor adhesion after adding metal particles. However, it should be noted that the epoxy layer may not be added into the conductive layer 12, mainly because the epoxy resin plays a role of adjusting viscosity in the conductive layer. When the amount of metal particles in polyurethane does not affect the viscosity of polyurethane, epoxy resin may not be added. Except for using epoxy resin to increase the viscosity of polyurethane, polyurethane may be modified with acrylates and the like to increase the viscosity thereof.

Preferably, the conductive layer 12 may further comprise a fire retardant. For example, a fire retardant may be added into the conductive layer 12 if the cable has a requirement for fire resistance. The mass ratio of the fire retardant in conductive layer 12 is generally 1%-10%.

The protective layer 13 is used for protecting the electromagnetic shielding film 1, thus an engineering film that is abrasion-resistant, water-proof and has a certain electrical insulating performance is selected, such as polyethylene terephthalate PET film, or polyimide PI film, or polyvinyl chloride PVC film, or polypropylene PP film, or polyethylene PE film, or ethylene-vinyl acetate copolymer EVA film, or polycarbonate PC film, or methyl methacrylate MMA film, or cast polypropylene film CPP film, or acrylonitrile-butadiene-styrene copolymer ABS film, or polyamide PA film. Preferably, the second protective film can be a PET film. PET film has following advantages: 1. PET has a good electrical insulation performance; 2. the hot deformation temperature and long-term operating temperature of PET are the highest among thermoplastic general engineering plastics; 2. due to high heat-resistance, reinforced PET hardly deforms or discolors after immerging in a soldering tin bath at 250° C. for 10 s, and is particularly suitable for preparing electronic or electrical parts for tin soldering; 3. PET has high bending strength, high elasticity modulus, good creep-resistance and fatigue resistance, and high surface hardness, and the mechanical properties of PET is similar to that of thermoset plastics; and 4. Since the ethylene glycol used for producing PET is almost half the price of butanediol used for producing PBT, the PET resin and reinforced PET have the most suitable prices among all the engineering plastics, having a relatively high cost performance. Optionally, the protective film 13 has a thickness of from 5 μm to 50 μm.

The protective film 13 provided by the present disclosure has a certain insulating property in addition to the protection for the electromagnetic shielding film 1. Thus, the electromagnetic shielding film provided by the present disclosure can satisfy the demand for a cable having low insulation requirements, thereby reducing the cost, and reducing the diameter of the cable coated with electromagnetic shielding film.

Figure 2:
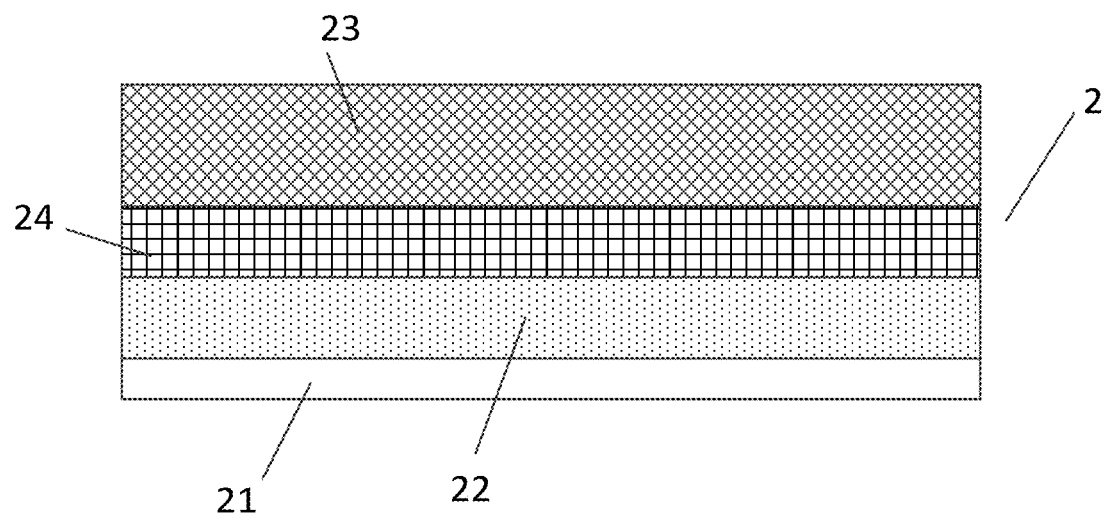
FIG. 2 shows another structure of the electromagnetic shielding film for a cable of the present disclosure.

In actual use, the electromagnetic shielding film 1 may also be provided with an insulating layer on the conductive layer 12 or on the protective film 13. Reference is made to FIG. 2. FIG. 2 shows another structure of the electromagnetic shielding film for a cable of the present disclosure. The electromagnetic shielding film 2 comprises a first metal layer 21, a conductive layer 22, a protective film 23 and an insulation layer 24;

the first metal layer 21 is coated on a jacket of the conductor of the cable, and is used for shielding electromagnetic interference and acts as a medium;

the conductive layer 22 is disposed on the first metal layer 21, and is used for shielding electromagnetic interference, and the conductive layer comprises a curing agent, metal particles and a polyurethane for carrying the metal particles; and the insulation layer 24 is disposed on the conductive layer 22, and the protective film 23 is disposed on the insulation layer 24, and is used for protecting the electromagnetic shielding film.

Compared with the example of FIG. 1, an insulation layer 24 is added in the present example, which can increase the insulation performance of the electromagnetic shielding film 2, isolate the inner electromagnetic wave from leakage and block the interference of external electromagnetic waves on the wire and cable. When the wire and cable are used in high-frequency high-speed transmission conditions, the insulation layer 24 is added in the electromagnetic shielding film to enhance the protection. When the wire and cable are used in normal transmission conditions, the insulation layer 24 may not be added, thereby reducing the cost of production of the electromagnetic shield film.

Preferably, the insulation layer 24 may comprise polyurethane and a coloring pigment. Compared with resin, polyurethane has excellent insulation performance and better flexibility and adhesiveness. The insulation layer 24 uses polyurethane instead of resin, which can reduce the reject rate during the production and reduce the cost. In addition, polyurethane absorbs electromagnetic waves better than resin, and can improve the insulation performances of products. The coloring pigment may be an inorganic pigment such as carbon black or metal pigment, or may be an organic pigment such as monoazo pigments, disazo pigments, phthalocyanine. The coloring pigment mainly plays a role of performing color discrimination and light shielding in the insulation layer 24.

Preferably, the insulation layer 24 further comprises a filler, which is used for increasing the filtering capability of the insulating layer on an electromagnetic wave; and the filler includes one or more of aluminum hydroxide, silicon dioxide, polyaniline and polyacetylene. The filler is added into the insulation layer, which may play a role of filtering the electromagnetic waves, thereby further increasing the filtering capability of the insulation layer 24 on an electromagnetic wave.

The insulation layer 24 may further comprise a fire retardant to increase the fire resistance of the electromagnetic shielding film 2 and to enhance the protection of the electromagnetic shielding film 2 to the cable.

Preferably, in the insulation layer 24, the polyurethane accounts for 70%-99% by mass, the coloring pigment accounts for 1%-30% by mass, the fire retardant accounts for 1%-10% by mass, and the filler accounts for 5%-40% by mass. The insulation layer has a thickness of 5 µm-50 µm.

It should be noted that the protective film 23 and the insulation layer 24 in the electromagnetic shielding film mainly play a role of providing protection, abrasion-resistance, water-proof, insulation, etc. Thus, the protection film 23 and the insulation layer 24 are disposed on the outermost layer of the electromagnetic shielding film. That is to say, they are the farthest from the cable conductor. However, the relative location between the protective film 23 and the insulation layer 24 are not defined, i.e., the insulation layer 42 may also be disposed on the protection film 23, at the outmost layer of the electromagnetic shielding film.

With respect to the first metal layer 21, conductive layer 22 and protective film 23 in the electromagnetic shielding film 2 in the present example, references are made to the first metal layer 11, conductive layer 12 and protective layer 13 in the electromagnetic shielding film 1 of the example in FIG. 1. They are not described here.

Figure 3:
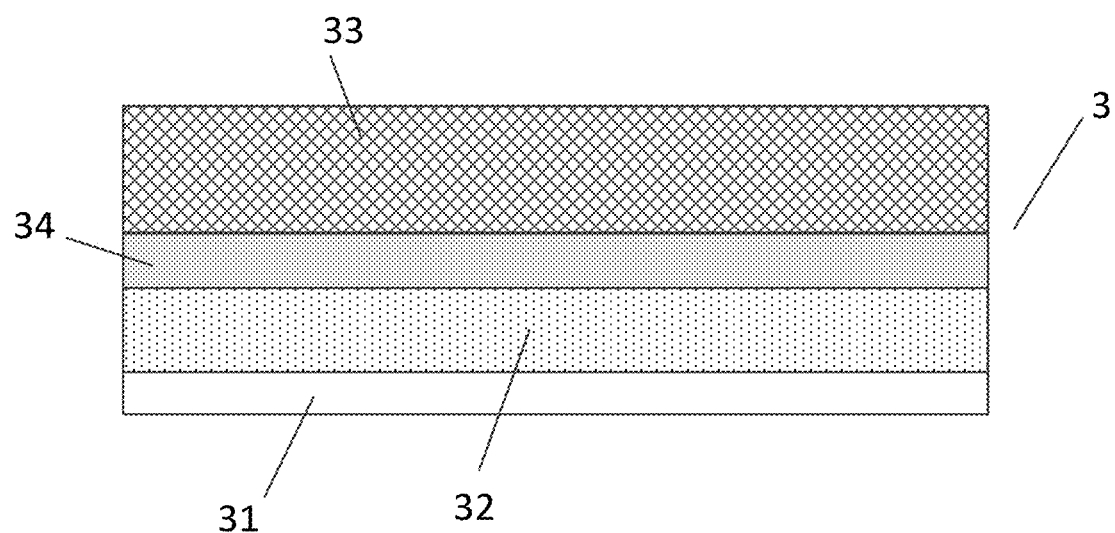
FIG. 3 shows another structure of the electromagnetic shielding film for a cable of the present disclosure.

In order to accelerate the conduction speed of the electromagnetic wave and increase the performance of electromagnetic shielding, reference is made to FIG. 3. FIG. 3 shows another structure of the electromagnetic shielding film for a cable of the present disclosure. The electromagnetic shielding film 3 comprises a first metal layer 31, a conductive layer 32, a protective film 33 and a second metal layer 34;

the first metal layer 31 is coated on a jacket of the conductor of the cable, and is used for shielding electromagnetic interference and acts as a medium;

the conductive layer 32 is disposed on the first metal layer 31, and is used for shielding electromagnetic interference, and the conductive layer 32 comprises a curing agent, metal particles and a polyurethane for carrying the metal particles;

the second metal layer 34 is disposed on the conductive layer 32, and is used for shielding in cooperation with the conductive layer 32; and the protective film 33 is disposed on the second metal layer 34, and is used for protecting the electromagnetic shielding film.

By adding a second metal layer 34 in the present example, the conduction speed of the electromagnetic wave can be accelerated, and the electromagnetic wave can be quickly carried out of the cable, thereby better avoiding the interference of the electromagnetic wave on the cable. Thus, use or not use of the second metal layer 34 is determined according to the requirement of the wire and cable for shielding. When the wire and cable are used in high-frequency high-speed transmission conditions, the second metal layer 34 is added to accelerate the conduction speed. When the wire and cable are used in normal transmission conditions, the second metal layer 34 may not be added, thereby reducing the cost of production.

Optionally, the second metal layer has a thickness of from 0.05 µm to 50 µm. Since the thickness of metal layer directly affects the conduction effect of electromagnetic wave, the second metal layer is prepared by different methods according to requirements of the wire and cable for shielding. For example, an electroplated metal layer may be made into 0.1 µm-3 µm, which can reduce the thickness of the product. However, if the metal layer is made of a film material, in which the metal films sold in the market have thicknesses of more than 7 µm, the price of the metal film having a thickness of more than 7 hi rises in multiples, thereby affecting the cost of production.

With respect to the first metal layer 31, conductive layer 32 and protective film 33 in the electromagnetic shielding film 3 of the present example, references are made to the first metal layer 11, conductive layer 12 and protective layer 13 in the electromagnetic shielding film 1 of the example in FIG. 1. They are not described here.

Figure 4:
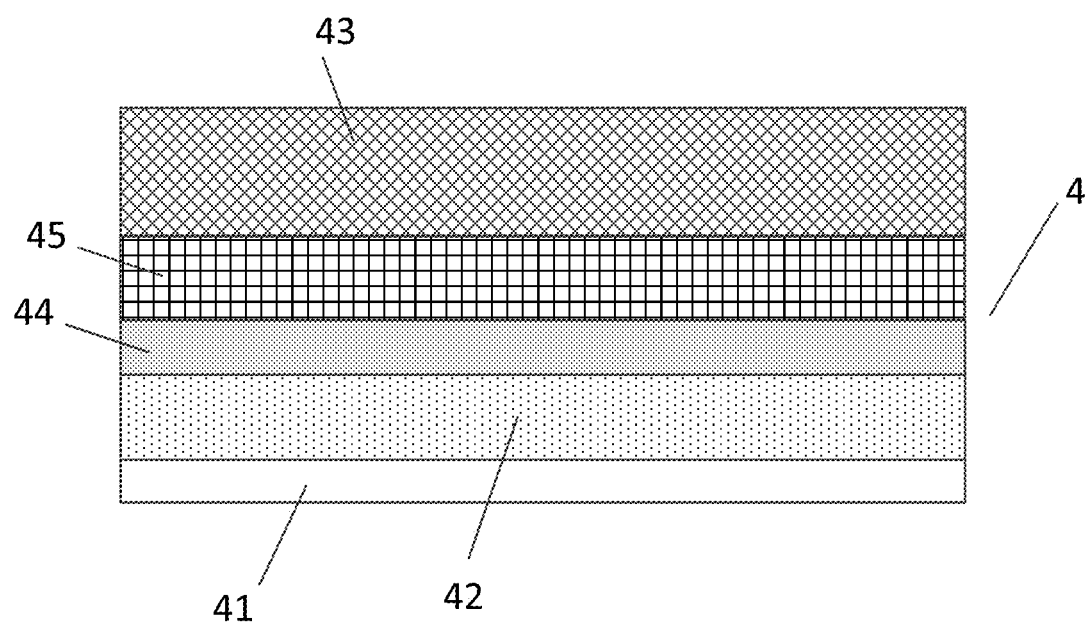
FIG. 4 shows another structure of the electromagnetic shielding film for a cable of the present disclosure.

In conjunction with the examples corresponding to FIG. 2 and FIG. 3, reference is made to FIG. 4. FIG. 4 shows another structure of the electromagnetic shielding film for a cable of the present disclosure. The electromagnetic shielding film 4 comprises a first metal layer 41, a conductive layer 42, a protective film 43, a second metal layer 44 and an insulation layer 45;

the first metal layer 41 is coated on a jacket of the conductor of the cable, and is used for shielding electromagnetic interference and acts as a medium;

the conductive layer 42 is disposed on the first metal layer 41, and is used for shielding electromagnetic interference, and the conductive layer 42 comprises a curing agent, metal particles and a polyurethane for carrying the metal particles;

the second metal layer 44 is disposed on the conductive layer 42, and is used for shielding in cooperation with the conductive layer 42; and the insulation layer 45 is disposed on the second metal layer 44, and the protective film 43 is disposed on the insulation layer 45, and is used for protecting the electromagnetic shielding film.

With respect to the first metal layer 41, conductive layer 42 and protective film 43 in the electromagnetic shielding film 4 of the present example, references are made to the first metal layer 11, conductive layer 12 and protective layer 13 in the electromagnetic shielding film 1 of the example in FIG. 1. With respect to the insulation layer 45 in the electromagnetic shielding film 4 of the present example, reference is made to the insulation layer 24 in the electromagnetic shielding film 2 of the example in FIG. 2. With respect to the second metal layer 44 in the electromagnetic shielding film 4 of the present example, reference is made to the second metal layer 34 in the electromagnetic shielding film 3 of the example in FIG. 3. They are not described here.

It should be noted that the protective film 43 and insulation layer 45 in the electromagnetic shielding film 4 mainly play a role of providing protection, abrasion-resistance, water-proof, insulation, etc. Thus, the protection film 43 and the insulation layer 45 are disposed on the outermost layer of the electromagnetic shielding film 4. That is to say, they are the farthest from the cable conductor. However, the relative location between the protective film 43 and the insulation layer 45 are not defined, i.e., the insulation layer 45 may also be disposed on the protection film 43, at the outmost layer of the electromagnetic shielding film. In particular, the material formed of a combination of the protective layer 43 and the second metal layer 44 may be directly purchased from the market. Thus, the electromagnetic shielding film 4 can be directly prepared from the material formed of a combination of the protective layer 43 and the second metal layer 44, and then the insulation layer 45 is coated on the protective film 43, which can reduce the product process and increase the production efficiency.

The electromagnetic shielding film 1, the electromagnetic shielding film 2, the electromagnetic shielding film 3 and the electromagnetic shielding film 4 in the examples of the present disclosure can be broadly used in wires and cables that need to be shielded in fields such as electric power, communication and signal transmission.

Figure 5:
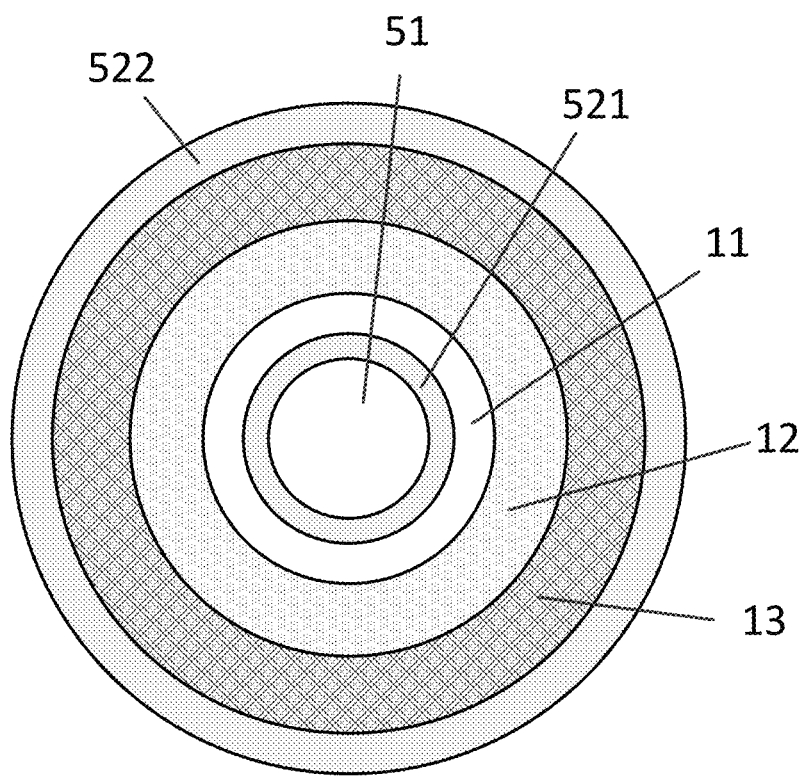
FIG. 5 shows radial cross section of the wire made from the electromagnetic shielding film of the present disclosure.

FIG. 5 shows radial cross section of the wire made from the electromagnetic shielding film 1 in an example of the present disclosure, which includes from the inner to the outer, a conductor 51, a jacket 521, a first metal layer 11, a conductive layer 12, a protective film 13 and a jacket 522, wherein the first metal layer 11, the conductive layer 12 and the protective layer 13 are components of the electromagnetic shielding film 1. It can be seen that compared with that repeatedly coated with Mylar aluminum foils and metal braided layers in the prior art, the present electromagnetic shielding film largely decreases the cost of production and the investment of equipment, and largely decreases the pollution of the environment due to cable production. For the radial distribution of each layer in the wires made from the electromagnetic shielding film 2 or the electromagnetic shielding film 3 or the electromagnetic shielding film 4 in the examples of the present disclosure, it can be easily obtained by one ordinary skilled in the art according to the example shown in FIG. 5, and is not repeated here.

Figure 6:
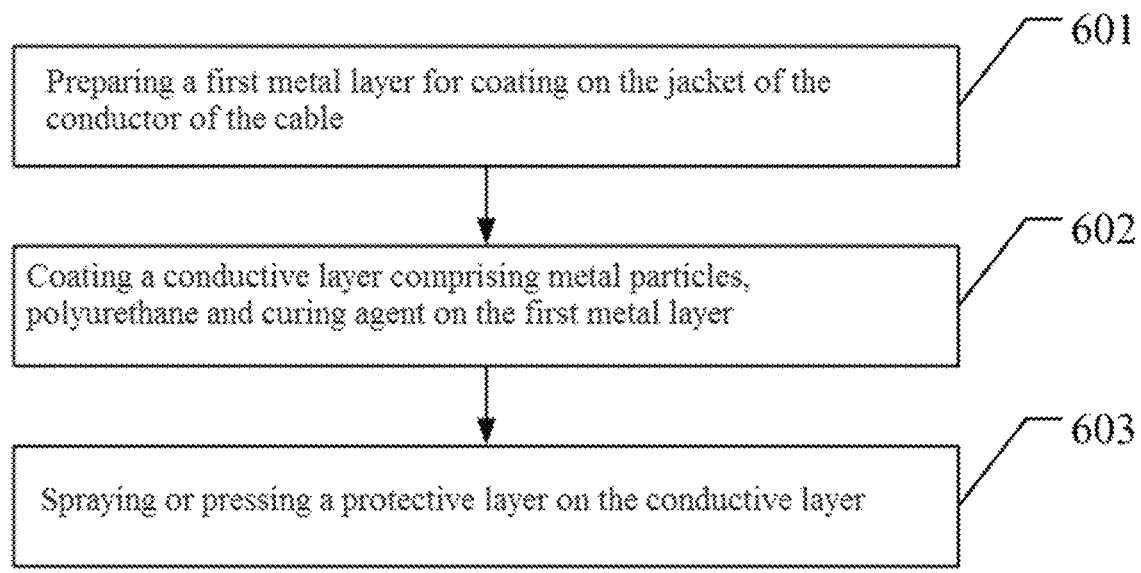
FIG. 6 shows an example of the method for preparing the electromagnetic shielding film for a cable of the present disclosure.

The electromagnetic shielding films in the examples of the present disclosure are described above. The method for preparing the electromagnetic shielding film in the examples of the present disclosure will be described hereinafter. The method for preparing the electromagnetic shielding film 1 in FIG. 1 is taken as an example. Reference is made to FIG. 6. FIG. 6 shows an example of a method for preparing the electromagnetic shielding film for a cable in an example of the present disclosure. The preparation method may comprise the following steps.

601. Preparing a first metal layer for coating on the jacket of the conductor of the cable First, a first metal layer with a required thickness is prepared according to the requirements of the specifically used wire, and the first metal layer can be used for the first shielding.

It should be noted that when preparing the first metal layer, a substrate may be disposed under the first metal layer in advance, so that the first metal layer is formed on the substrate, and a first metal layer with relatively high quality is formed. At the same time, the substrate and the first metal layer can be separated easily. For example, the first metal layer is prepared by casting, and then is molded to a desired thickness.

602. Coating a conductive layer comprising metal particles, polyurethane and curing agent on the first metal layer After the preparation of the first metal layer is completed, the conductive layer comprising metal particles, polyurethane and curing agent is prepared by coating. The metal particles in the conductive layer are isotropic conductive or anisotropic conductive metal particles, and the thickness of the conductive layer is determined according to the requirements of the cable.

It should be noted that by means of coating, the conductive layer formed of metal particles and polyurethane is uniformly distributed on the metal layer, so that not only the quality of the formed conductive layer is high, but also the efficiency of forming conductive layer is relatively high.

603. Spraying or pressing a protective layer on the conductive layer.

After the preparation of the conductive layer is completed, a protective film with a required thickness is prepared according to the requirements of the specifically used wire on the conductive layer by spraying, or the pre-prepared protective film can be pressed on the conductive layer. The protective film can be an engineering film such as polyethylene terephthalate PET film, or polyimide PI film, or a polyvinyl chloride PVC film, or a polypropylene PP film, or polyethylene PE film, or ethylene-vinyl acetate copolymer EVA film, or polycarbonate PC film, or methyl methacrylate MMA film, or cast polypropylene film CPP film, or acrylonitrile-butadiene-styrene copolymer ABS film, or polyamide PA film.

It can be seen that in the preparation method in the examples of the present disclosure, first, a first metal layer with a required thickness is prepared according to the requirements of the specifically used wire, and the first metal layer can be used for the first shielding; the conductive layer comprising metal particles, polyurethane and a curing agent is coated on the first metal layer by evaporation plating or coating; after preparation of the conductive layer is completed, a protective film is formed on the conductive layer by spraying or pressing, thereby preparing a high-quality electromagnetic shielding film that has accurate thickness and uniform surface.

It should be noted that in actual production process, an electromagnetic shielding film may be prepared by an opposite manner to the example in FIG. 6; that is, firstly, a protective film is formed, and then a protective film is used as a carrier, and a conductive layer is coated on the protective film, and then a first metal layer is formed on the conductive layer.

The method for preparing the electromagnetic shielding film for a cable in the examples of the present disclosure is described above. The method for preparing the cable in the examples of the present disclosure will be described hereinafter.

Figure 7:
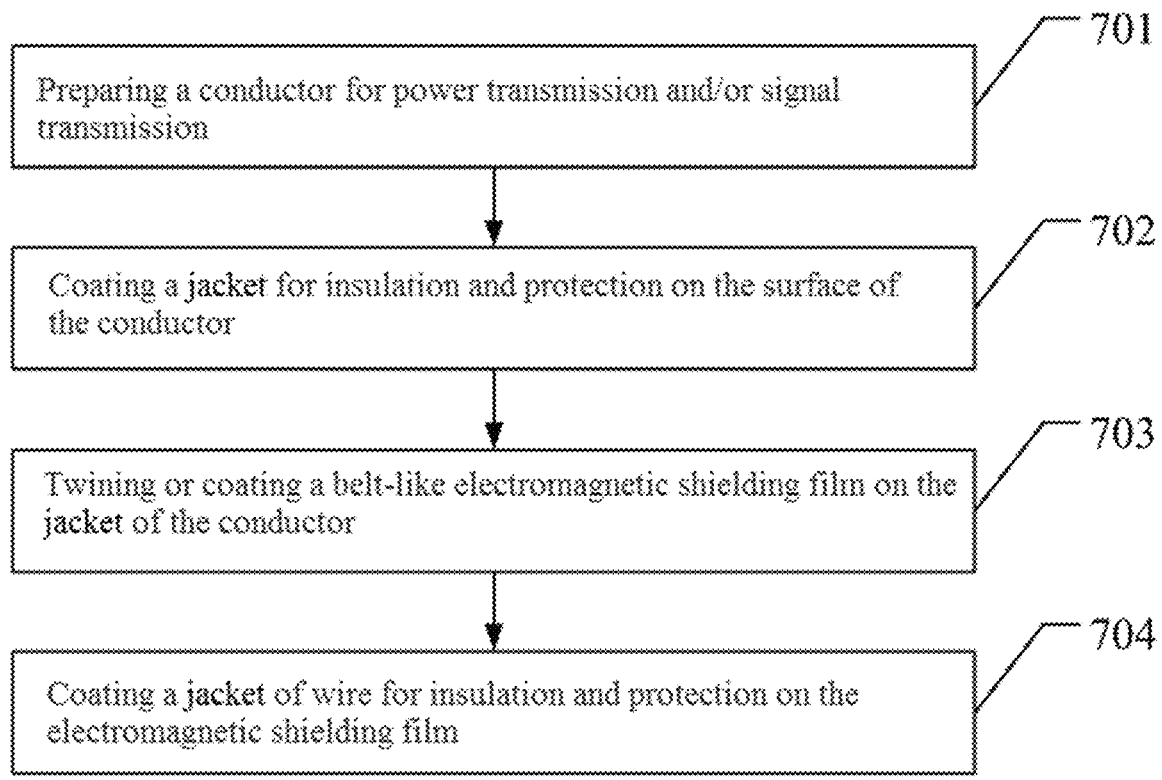
FIG. 7 shows an example of the method for preparing the wire of the present disclosure.

Reference is made to FIG. 7. FIG. 7 shows an example of the method for preparing wire in the present disclosure. The method for preparing the wire in the example of the present disclosure may comprise the following steps.

701. Preparing a conductor for power transmission and/or signal transmission In the preparation of cable, a conductor for power transmission and/or signal transmission is firstly generated.

It should be noted that the conductor may be a conductor for power transmission, or a conductor for signal transmission, or a conductor for both power transmission and signal transmission.

702. Coating a jacket for insulation and protection on the surface of the conductor After the preparation of conductor is completed, a jacket of the conductor for insulation and protection may be coated on the surface of the conductor.

Figure 8:
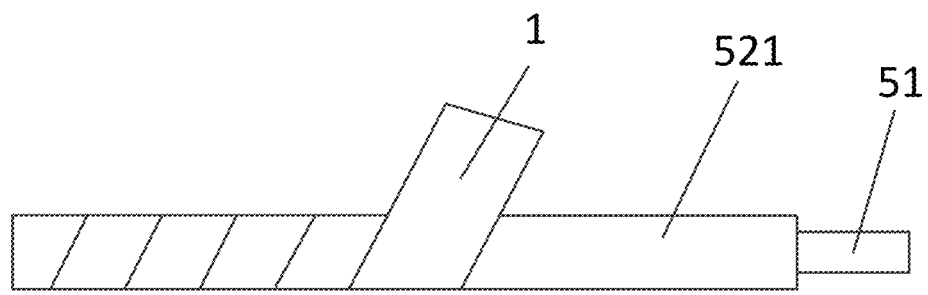
FIG. 8 shows another example of the method for preparing the wire of the present disclosure.

703. Twining or coating a belt-like electromagnetic shielding film on the jacket of the conductor After coating of a jacket for insulation and protection on the surface of the conductor, a belt-like electromagnetic shielding film can be twined or coated on the jacket of the conductor, and the electromagnetic shielding film is the electromagnetic shielding film shown in the examples shown in FIG. 1, FIG. 2, FIG. 3 or FIG. 4. After the preparation of the jacket of conductor is completed, as shown in FIG. 8, the belt-like electromagnetic shielding film 1 can be twined or coated on the jacket 521 of the conductor 51.

Preferably, in order to utilize the production equipment existing in the prior art, the jacket of the conductor can be twined with the electromagnetic shielding film using a Mylar aluminum foil winding machine or can be coated with the electromagnetic shielding film using a coating machine. Since the shielding film in the examples of the present disclosure has a belt-like structure and the Mylar aluminum foil itself also has a belt-like structure, in the method for preparing the wire according to the present disclosure, the Mylar aluminum foil winding machine or the coating machine in the method for preparing cable in the prior art can be used as the equipment for twining or coating the shielding film, thereby preparing products with the same or better quality while reducing the production equipment of the prior art. In contrast, the production of metal braided layer requires a specific equipment, and the cost of the equipment is relatively high. Thus, the method for preparing the wire in the examples of the present disclosure can greatly reduce the production cost of the wire in mass production of cable. At the same time, the method does not need metal braided layer and metal materials for preparing braiding, thereby saving a large amount of raw materials eliminating environmental pollution.

704. Coating a jacket of the cable for insulation and protection on the electromagnetic shielding film;

After the twining or coating of the electromagnetic shielding film is completed, a jacket of wire for insulation and protection may be coated on the electromagnetic shielding film, and the jacket of wire acts as the protective film at the outermost of the wire.

It should be noted that this process may not be carried out in actual use, i.e., the electromagnetic shielding film may not be coated with the jacket of wire. Whether the jacket of wire is coated or not depends on the protection requirements of the cable. As for some wires and cables without need of too strict requirement for protection, the electromagnetic shielding film may not be coated with the jacket of wire, and directly use the protective film in the electromagnetic shielding film as the protective film of the wire, such as the wires used inside of an equipment and is protected by the shell of the equipment. For some cables or electric wires used in the outdoors or under tough conditions, a jacket of cable should be coated, which on one hand acts as a protective film, and on the other hand increases the insulating performance.

Figure 9:
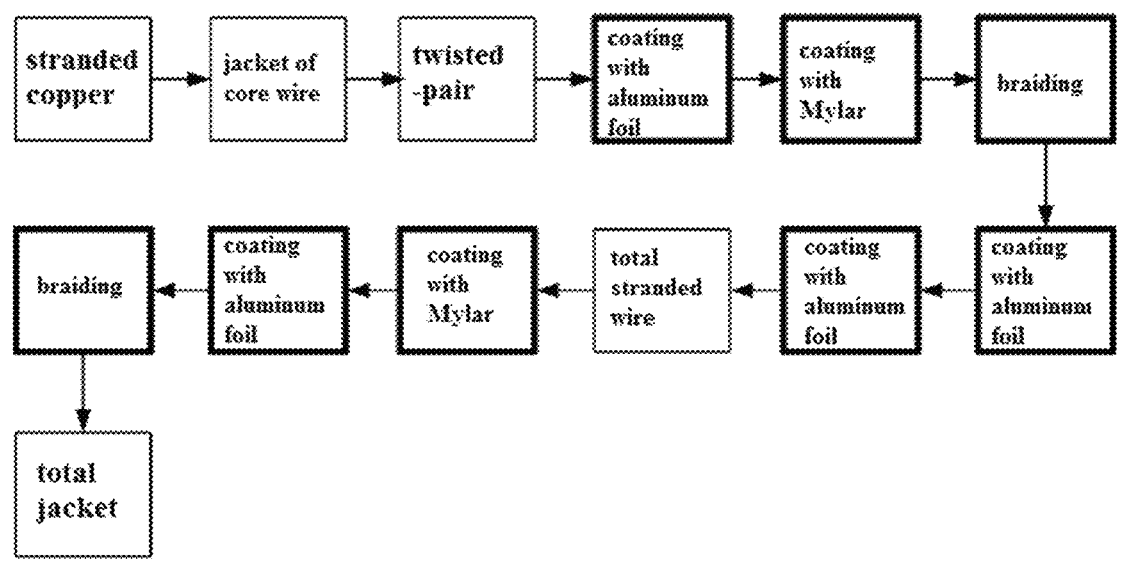
FIG. 9 shows a process for preparing the wire in the prior art.
Figure 10:
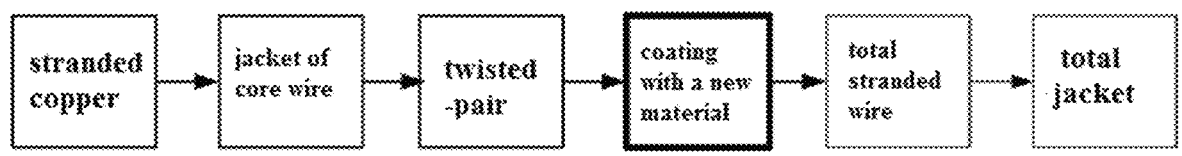
FIG. 10 shows a process for preparing the wire in the present disclosure.

Reference is made to FIG. 9, which shows a process for preparing the wire by method of braiding. FIG. 10 shows a process for preparing the wire in the present disclosure. It can be seen the method for preparing wires in the examples of the present disclosure differs from the method for preparing braided wires in the prior art in that, in the prior art, Mylar aluminum foil is twined, and after twining a metal braided layer is coated, and the coating and braiding process may be carried out for multi times, whereas the examples of the present disclosure only adopts step 703, i.e., twining or coating a belt-like shielding film on the jacket of the conductor may replace the corresponding complicated steps in the prior art, thereby greatly improving the production efficiency of the wire. In addition, the metal braided layers are saved and no complicated braiding process is required, and no electroplating is required, without pollution to the environment. In the prior art, a Mylar aluminum foil winding or coating machine needs to be equipped with dozens of to hundreds of braiding machines to braid the metal braided layer. The cost of equipment is high, and the too many equipment takes too much space. In contrast, the solution in the examples of the present disclosure needs no braiding process, and thus the cost of equipment is greatly decreased, and the space occupied by the equipment is greatly decreased.

An example of the performance test of the wire produced by the method for preparing shielding films and wires in the examples of the present disclosure are shown hereinafter.

Figure 11:
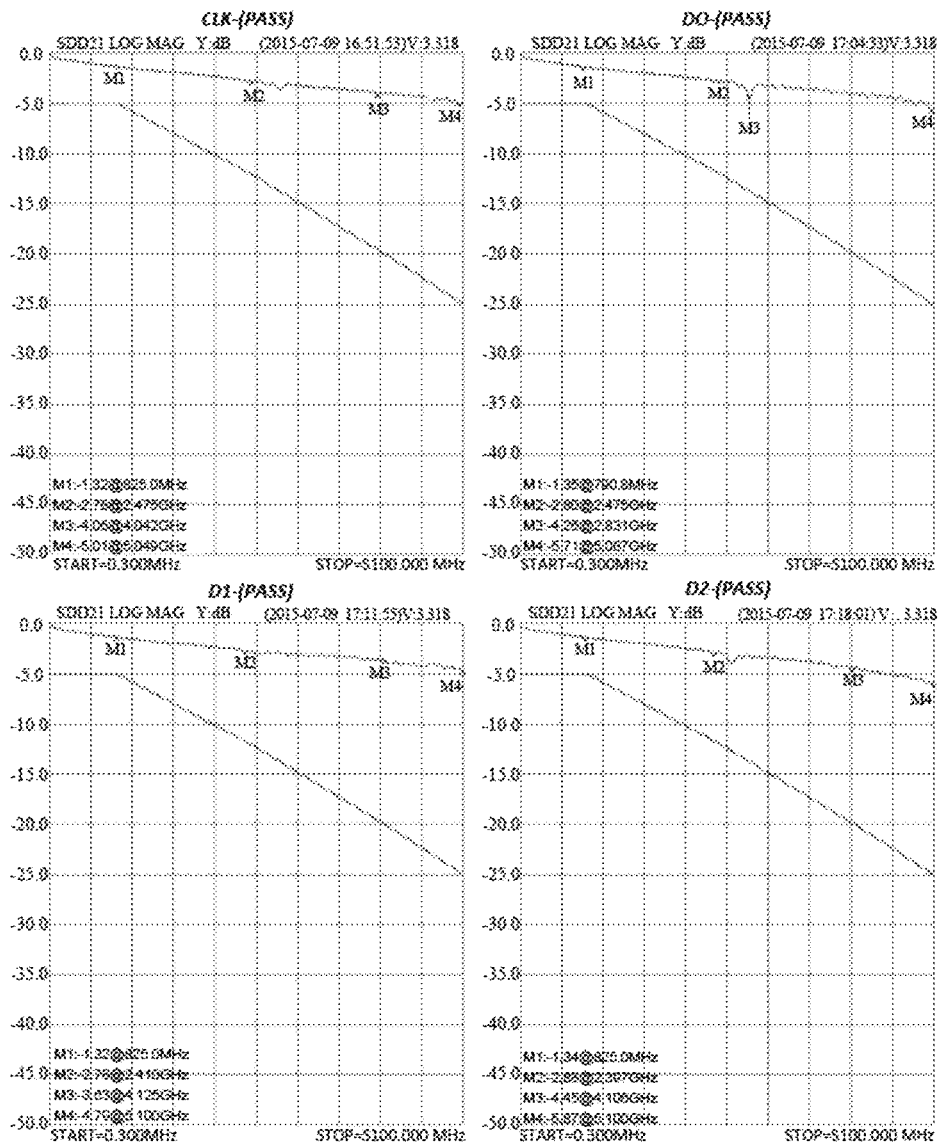
FIG. 11 shows a performance test diagram of an HDMI wire using the shielding film according to an example of the present disclosure.
Figure 12:
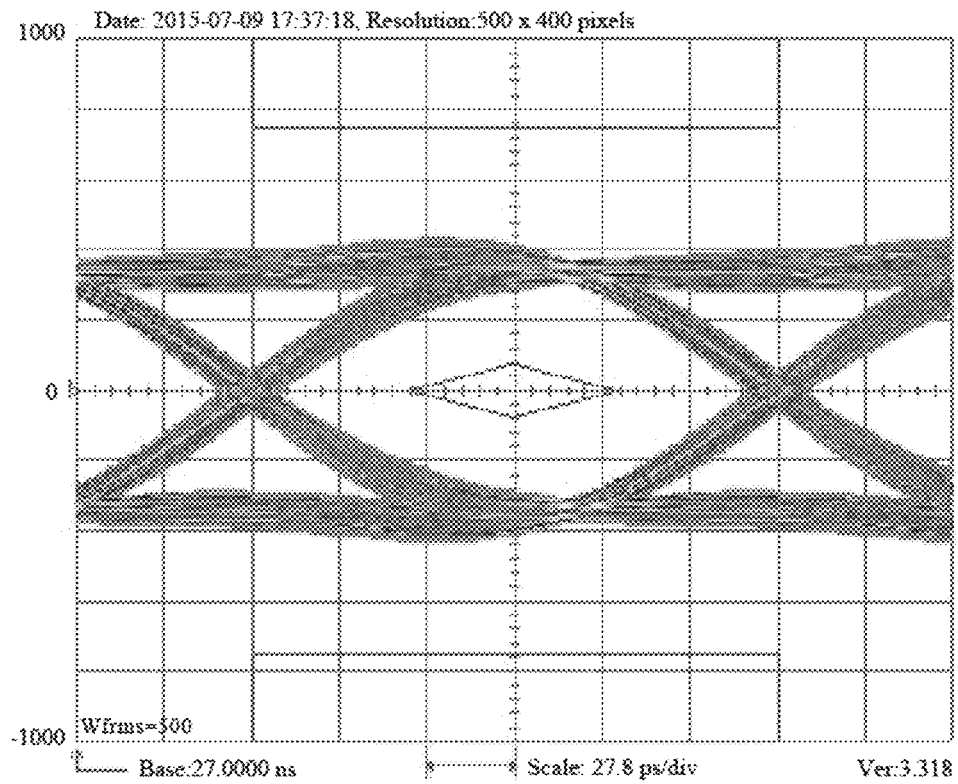
FIG. 12 shows the eye diagram of an HDMI wire using the shielding film according to an example of the present disclosure.

For example, as for the test of an HDMI wires using the shielding film in the examples of the present disclosure, reference is made to FIG. 11 and FIG. 12. FIG. 11 shows a performance test diagram of an HDMI wire using the shielding film in the examples of the present disclosure, wherein all of CLK, D0, D1 and D2 pass the test. FIG. 12 shows the eye diagram of an HDMI wire using the shielding film in the examples of the present disclosure. The HDMI wire is prepared according to the HDMI1.4 standard. It can be seen from the eye diagram that the wire prepared using the shielding film in the examples of the present disclosure according to the HDMI1.4 standard can pass the HDMI 2.0 test easily.

Figure 13:
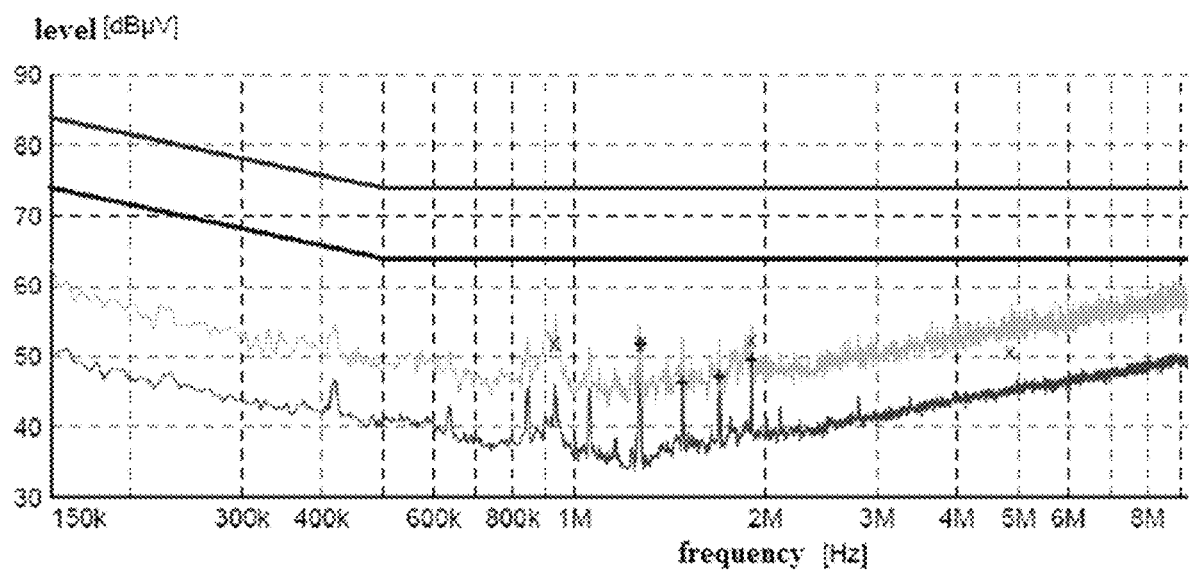
FIG. 13 shows the performance test diagram of a Category 6 network cable using the shielding film according to an example of the present disclosure.

For example, as for the test of a Category 6 network wire using the shielding film in the examples of the present disclosure, reference is made to FIG. 13. FIG. 13 shows the performance test diagram of a Category 6 network wire using the shielding film in the examples of the present disclosure. It can be seen from FIG. 13 that the Category 6 network wire using the shielding film in the examples of the present disclosure can pass the corresponding test easily.

In addition to the above tests, there are many wires made from the shielding films in the examples of the present disclosure, and all of them can easily pass the standard test of the corresponding wires. They are not listed one by one herein due to space limitation. It can be seen from the above test data that the shielding film in the examples of the present disclosure has broad market prospects due to its high quality and low cost characteristics.

It should be understood that the system, device and method disclosed in the above examples can be implemented in other manners. For example, the device examples described above are merely illustrative. For example, the division of a unit is only a logical function division, and there may be another division manner in actual implementation. For example, multiple units or components may be combined or integrated into another system, or some features may be omitted or not implemented. In addition, the mutual coupling or direct coupling or communication connection shown or discussed may be indirectly coupled or communicatively connected through some interfaces, devices or units, which may be in electrical, mechanical or other form.

The units described as separate components may or may not be physically separate. The components displayed as units may or may not be physical units, i.e., they may be located in one place, or may be distributed to multiple network units. Some or all of the units may be selected according to actual requirements to achieve the purpose of the embodiment.

In addition, each functional unit in each example of the present disclosure may be integrated into one processing unit, or each unit may exist physically separately, or two or more units may be integrated into one unit. The above integrated unit can be implemented in the form of hardware or in the form of a software functional unit.

An integrated unit, if implemented in the form of a software functional unit and sold or used as a standalone product, can be stored in a computer readable storage medium. Based on such understanding, an essential part of the technical solution of the present disclosure, or a part contributing to the prior art, or all or part of the technical solution can be embodied in the form of a software product. The computer software product is stored in a storage medium, including a number of instructions to order a computer device (which may be a personal computer, server, or network device, etc.) to perform all or part of the steps of the various processes in the present disclosure. The foregoing storage medium comprises various mediums which can store procedure codes such as a U disk, a mobile hard disk, a read-only memory (ROM), a random access memory (RAM), a magnetic disk, an optical disk.

The above embodiments are only intended to illustrate the technical solutions of the present disclosure, but are not intended to limitation. Although the present disclosure has been described in detail with reference to the foregoing embodiments, those skilled in the art should understand that they may still modify the technical solutions described in the foregoing embodiments, or perform equivalent replacement on some of the technical features. These modifications or substitutions do not depart from the spirit and scope of the technical solutions of the embodiments of the present disclosure.

The invention claimed is:

1. An electromagnetic shielding film for a cable, wherein the electromagnetic shielding film comprises a first metal layer, a conductive layer and a protective film;
    the first metal layer is coated on a jacket of a conductor of the cable, and is used for shielding electromagnetic interference and acts as a medium;
    the conductive layer is disposed on the first metal layer, and is used for shielding electromagnetic interference, and the conductive layer comprises a curing agent, metal particles and a polyurethane for carrying the metal particles; and
    the protective film is disposed on the conductive layer, and is used for protecting the electromagnetic shielding film;
    wherein the electromagnetic shielding film further comprises an insulating layer, and the insulating layer is disposed on the conductive layer, or is disposed on the protective film;
    wherein the insulating layer comprises polyurethane and a coloring pigment.

2. The electromagnetic shielding film for a cable according to claim 1, wherein the conductive layer further comprises an epoxy resin, which is used for increasing the adhesiveness of the conductive layer.

3. The electromagnetic shielding film for a cable according to claim 1, wherein the metal particles are combined particles formed from two or more kinds of metals.

4. The electromagnetic shielding film for a cable according to claim 1, wherein the protective film is an engineering film.

5. The electromagnetic shielding film for a cable according to claim 1, wherein the metal particles accounts for 10%-80% by mass of the conductive layer.

6. The electromagnetic shielding film for a cable according to claim 1, wherein the insulating layer further comprises a filler, which is used for increasing the filtering capability of the insulating layer on an electromagnetic wave; and
    the filler includes one or more of aluminum hydroxide, silicon dioxide, polyaniline and polyacetylene.

7. The electromagnetic shielding film for a cable according to claim 1, wherein the insulating layer further comprises a fire retardant.

8. The electromagnetic shielding film for a cable according to claim 1, wherein the electromagnetic shielding film further comprises a second metal layer, wherein the second metal layer is disposed on the conductive layer, and is used for shielding in cooperation with the conductive layer.

* * * * *